United States Patent
Wu et al.

[11] Patent Number: 5,892,262
[45] Date of Patent: Apr. 6, 1999

[54] CAPACITOR-TRIGGERED ELECTROSTATIC DISCHARGE PROTECTION CIRCUIT

[75] Inventors: Chau-Neng Wu, Kaoshiung Hsien; Ming-Dou Ker, Tainan Hsien, both of Taiwan

[73] Assignee: Winbond Electronics Corp., Hsinchu, Taiwan

[21] Appl. No.: 655,073

[22] Filed: Jun. 3, 1996

[51] Int. Cl.⁶ .................................................. H01L 23/62
[52] U.S. Cl. ............................................................ 257/356
[58] Field of Search .............................................. 257/356

[56] References Cited

U.S. PATENT DOCUMENTS

| | | | |
|---|---|---|---|
| 3,470,390 | 9/1969 | Lin | 257/356 |
| 5,089,875 | 2/1992 | Koyama | 257/356 |
| 5,290,724 | 3/1994 | Leach | 257/356 |
| 5,301,084 | 4/1994 | Miller | 257/356 |

*Primary Examiner*—Stephen Meier
*Attorney, Agent, or Firm*—Rabin & Champagne, P.C.

[57] ABSTRACT

A capacitor-triggered electrostatic discharge (ESD) protection circuit is disposed between a metal pad and $V_{ss}$ potential level, wherein the pad may be an input pad, an output pad, or a $V_{DD}$ power rail. The circuit includes a thick oxide device, a capacitor, and a resistor. The thick oxide device is configured with its drain and source connected to the pad and circuit ground $V_{SS}$, respectively. The gate of the thick oxide device is tied to the pad, and the oxide device bulk is coupled by the resistor to circuit ground $V_{SS}$. The capacitor is connected between the pad and the bulk of the thick oxide device. The bulk of the device is constructed by a P-well region formed in a substrate. The capacitor is formed between the pad and a polysilicon layer just therebelow, without consuming extra layout areas. When a positive-to-ground ESD pulse is conducted at the pad, the capacitor will couple the ESD voltage to the well region, forward bias the bulk/source junction, and then turn on the thick oxide device operated in a bipolar mode to bypass the ESD stress. Moreover, a diode is connected between the pad and circuit ground by its cathode and anode, respectively, to bypass a negative-to-ground ESD pulse. The diode can be an extra or built-in PN junction.

9 Claims, 5 Drawing Sheets

5,892,262

CAPACITOR-TRIGGERED ELECTROSTATIC DISCHARGE PROTECTION CIRCUIT

BACKGROUND OF THE INVENTION

1. Field of the Invention

The present invention relates generally to a technique for protecting against electrostatic discharge damage during integrated circuit fabrication. More particularly, the present invention relates to a capacitor-triggered electrostatic discharge protection circuit.

2. Description of the Related Art

Electrostatic discharge, hereinafter "ESD", is a common phenomenon that occurs during handling of semiconductor integrated circuit ("IC") devices. An electrostatic charge may accumulate for various reasons and cause potentially destructive effects on an IC device. Damage typically can occur during a testing phase of an IC's fabrication, during assembly of the IC onto a circuit board, as well as during use of equipment into which the IC has been installed. Damage to a single IC due to poor ESD protection in an electronic device can partially or sometimes completely hamper its functionality. ESD protection for semiconductor ICs is, therefore, a reliability issue.

ESD stress models are based on the reproduction of typical discharge pulses to which the IC may be exposed during manufacturing or handling. Three standard models, known as the Human Body Model (HBM), Machine Model (MM), and Charged Device Model (CDM) have been developed. The human-body model is set forth in U. S. Military Standard MIL-STD-883, Method 3015.6. This Military Standard models the electrostatic stress produced on an IC device when a human carrying an electrostatic charge touches the lead pins of the IC device. The machine model is set forth in Industry Standard EIAJ-IC-121, which describes the electrostatic stress produced on an IC device when a machine carrying an electrostatic charge contacts the lead pins of the IC device. The charged device model describes the ESD current pulse generated when an IC device already carrying an electrostatic charge is grounded in the process of being handled.

Referring to FIGS. 1 and 2, circuit diagrams of ESD protection circuits conventionally used respectively with an input pad and an output pad of an IC package are schematically depicted. As shown in FIG. 1, an NMOS transistor $M_1$ is utilized to protect an internal circuit 6 from the ESD stress that may appear at the input pad 5. The gate, source, and bulk of the NMOS transistor $M_1$ are all tied to circuit ground $V_{SS}$. The drain of the NMOS transistor $M_1$ is connected to the input pad 5. As shown in FIG. 2, an output buffer consisting of an NMOS transistor $M_2$ and a PMOS transistor $M_3$ is employed to protect the internal circuit 6 from ESD damage at the output pad 7. Accordingly, gates of the NMOS and PMOS transistors are both coupled to the internal circuit 6, drains of which are tied together and to the output pad 7. Moreover, the source and bulk of the NMOS $M_2$ are tied together and to circuit ground $V_{SS}$. The source and bulk of the PMOS transistor $M_3$ are tied together and to a $V_{DD}$ power rail. However, in light of the trend toward submicron scale IC fabrication, NMOS transistor vulnerability to ESD stress has been greatly reduced due to advanced processes, such as using lightly-doped drain (LDD) structure and clad silicide diffusions. Moreover, those devices with higher ESD immunity, such as a diode or a thick oxide device $M_4$ shown in FIG. 3, have a triggering voltage higher than the breakdown voltage of a submicron-NMOS transistor. Accordingly, those devices are suited to operate in providing protection at the input pad 5, but are useless in providing protection at the output pad 7 because the ESD stress may cause damage to the NMOS transistor of an output buffer. In addition, the ESD pulse may damage the internal circuit 6 from the $V_{DD}$ to $V_{SS}$ power rail. As C. Duvvury et al. proposed in his paper "INTERNAL CHIP ESD PHENOMENA BEYOND THE PROTECTION CIRCUITS" in IEEE Transactions on Electron Devices, 35 (12), 1988, latchup effect degradation of circuit performance is unavoidable. Consequently, there is a need for an ESD protection circuit that can be used at any of the IC components likely to introduce ESD to the internal circuit, such as at an input pad, an output pad, or a power rail, in order to protect the internal circuit from ESD damage.

SUMMARY OF THE INVENTION

The invention is a capacitor-triggered ESD protection circuit that can protect an internal circuit from ESD damage at input pads, output pads, or power rails. The same circuit design can be used in different configurations to protect the internal circuit from ESD damage at each of the above locations. Moreover, the invention is a capacitor-triggered ESD protection circuit used to bypass an ESD current in a uniformly distributed flow, which can minimize local heating of the protection circuit.

The present invention achieves the above-identified advantages by providing a capacitor-triggered electrostatic discharge protection circuit, fabricated in an IC package that essentially comprises:

an N-type semiconductor substrate; a P-well region formed in the substrate; a contact region formed in the well region; an isolating structure formed on the substrate; a polysilicon layer formed on the isolating structure and coupled to the contact region; a dielectric layer overlying the polysilicon layer; a metal pad overlying the dielectric layer so as to form with the dielectric layer and the polysilicon layer a capacitor that couples an ESD voltage appearing at the pad to the well region; a first heavily-doped N-type region and at least a second heavily-doped N-type region, formed in the well region and spaced apart to constitute with the well region a bipolar junction transistor, wherein the first heavily-doped region is coupled to the pad and the second heavily-doped region is coupled to the circuit ground, so as to bypass the ESD voltage at the pad while the bipolar junction transistor is triggered by the coupling of the capacitor; and a resistor connected between the contact region and the circuit ground to provide a time delay with the capacitor.

This circuit may also be constructed in a different manner, as long as the components are connected according to the present invention in order to provide ESD protection for a circuit at the input lead, the output lead, or the power lead of the circuit. The circuit includes a thick oxide device having a drain and a gate, coupled to the protected circuit and to the potential ESD input. The gate is coupled to the bulk of the oxide device by a capacitor. The source of the oxide device is coupled directly to ground, and the bulk is coupled to ground by a resistor. A diode having a grounded anode may be coupled to the protected circuit at a cathode to provide further protection.

BRIEF DESCRIPTION OF THE DRAWINGS

These and other objects, features, and advantages of the present invention will become apparent by way of the following detailed description of the preferred but non-limiting embodiments. The description is made with reference to the accompanying drawings, wherein.

DETAILED DESCRIPTION OF THE PREFERRED EMBODIMENTS

Figure 1:
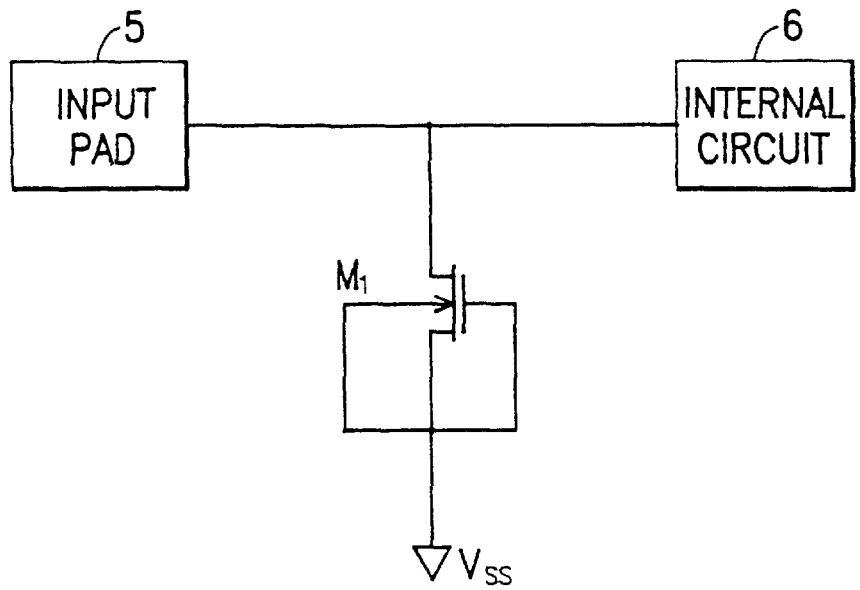
FIG. 1 is a schematic diagram of a conventional ESD protection circuit composed of a NMOS transistor at an input pad.
Figure 2:
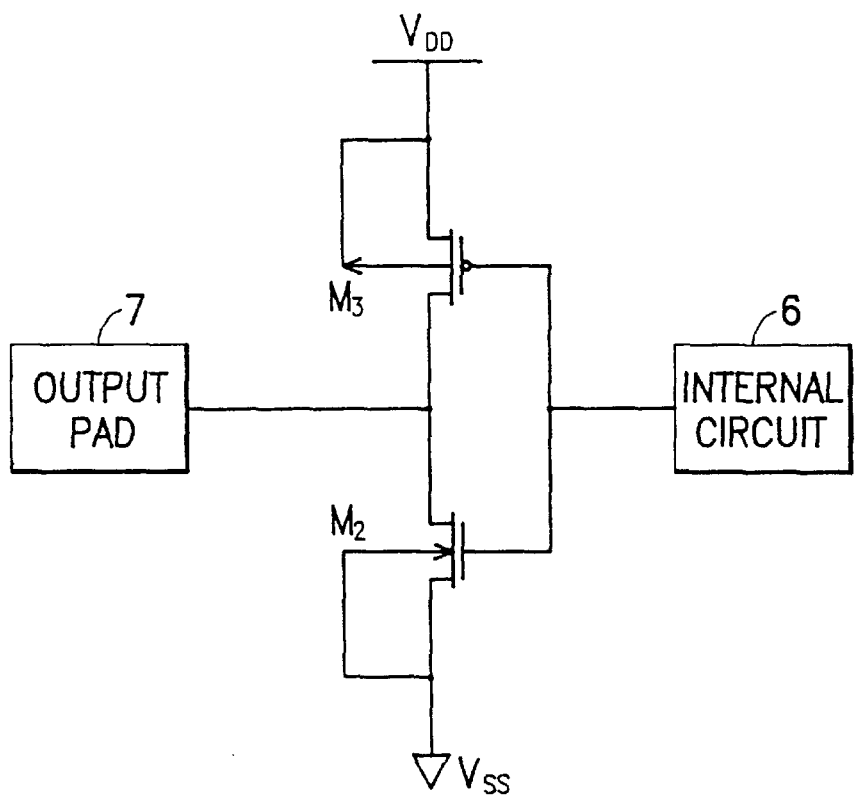
FIG. 2 is a schematic diagram of a conventional ESD protection circuit made of an output buffer at an output pad.
Figure 3:
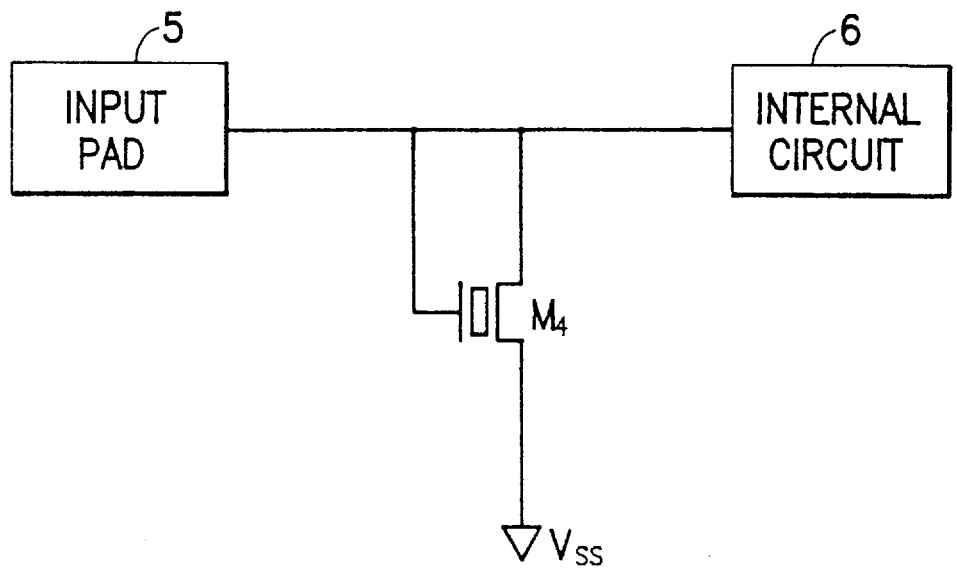
FIG. 3 is a schematic diagram of a conventional ESD protection circuit composed of a thick oxide device at an input pad.
Figure 4:
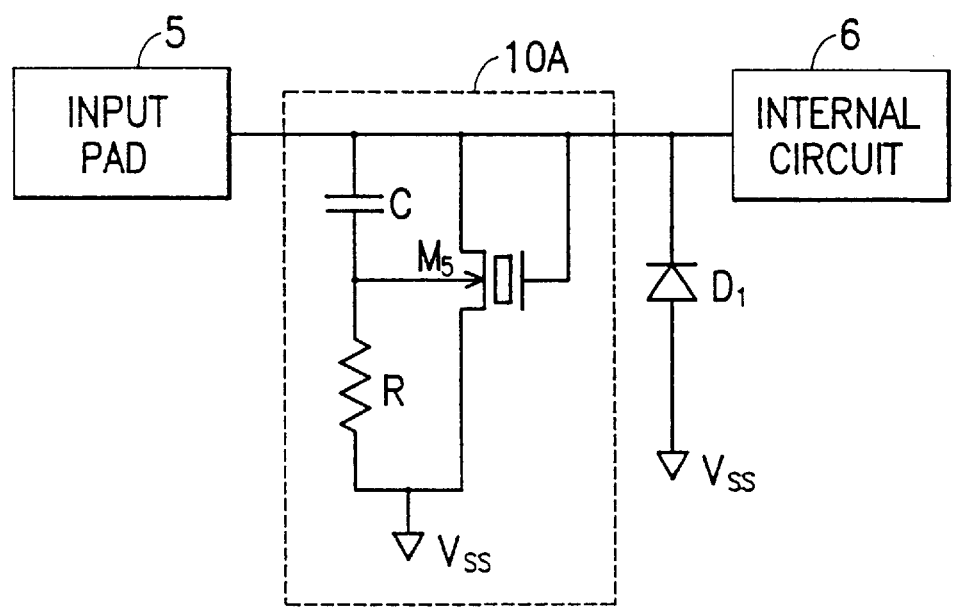
FIG. 4 is a schematic diagram of a capacitor-triggered ESD protection circuit in accordance with the present invention, disposed at an input pad.

Referring to FIG. 4, a capacitor-triggered ESD protection circuit 10A, in accordance with the present invention, is depicted positioned at an input pad 5. The input pad 5 is connected to an internal circuit 6, which is the circuit to be protected from ESD damage. The capacitor-triggered ESD protection circuit 10A comprises a thick oxide device $M_5$, a capacitor C, and a resistor R. The thick oxide device $M_5$ is configured with a drain connected the input pad 5 and with a source connected to circuit ground $V_{SS}$. A gate of the thick oxide device $M_5$ is also tied to the input pad 5. The bulk of the thick oxide device $M_5$ is coupled by the resistor R to circuit ground $V_{ss}$. The capacitor C is connected between the input pad 5 and the bulk of the device $M_5$. In addition, a diode $D_1$ is connected at its anode to circuit ground $V_{SS}$ and at its cathode to the input pad 5.

Figure 5:
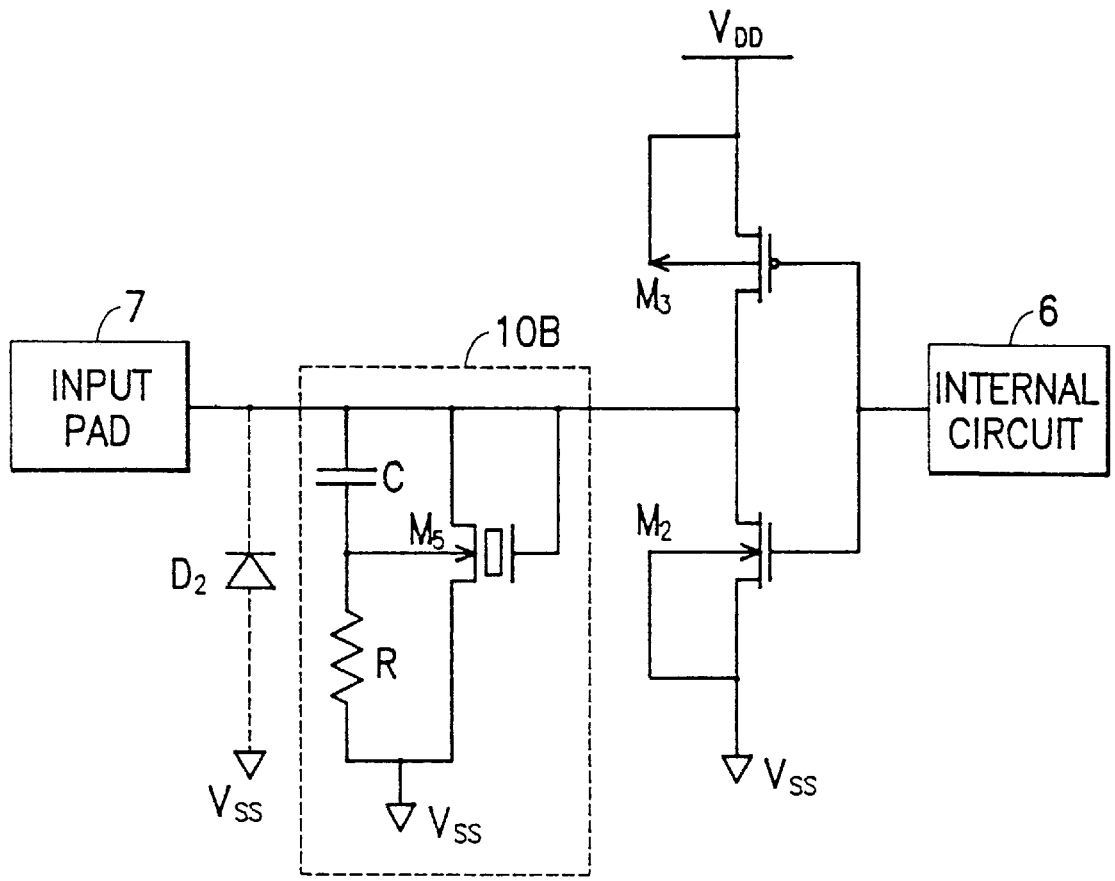
FIG. 5 is a schematic diagram of a capacitor-triggered ESD protection circuit in accordance with the present invention, disposed at an output pad.

Referring to FIG. 5, a capacitor-triggered ESD protection circuit 10B, in accordance with the present invention, of the same structure as ESD protection circuit 10A of FIG. 4, is depicted positioned at an output pad 7. The output pad 7 is coupled by an output buffer to the internal circuit 6. The output buffer comprises a PMOS transistor $M_3$ and an NMOS transistor $M_2$ configured with both drains tied together as an output connection to the output pad 7, and with both gates tied together as a circuit connection, disposed such that the gates are controlled by the internal circuit 6. The source and bulk of the NMOS transistor $M_2$ are tied together and to circuit ground $V_{SS}$, and the source and the bulk of the PMOS transistor $M_3$ are connected together and to the power rail $V_{DD}$. The capacitor-triggered ESD protection circuit 10B comprises a thick oxide device $M_5$, a capacitor C, and a resistor R. The thick oxide device $M_5$ is configured with its drain connected to the output pad 7 and with its source connected to circuit ground $V_{SS}$. The gate of the thick oxide device $M_5$ is also tied to the output pad 7. The bulk of the thick oxide device $M_5$ is coupled by the resistor R to circuit ground $V_{SS}$. The capacitor C is connected between the output pad 7 and the bulk of the device $M_5$. In addition, a diode $D_2$ is preferably connected at its anode to circuit ground $V_{SS}$ and at its cathode to the output pad 7.

Figure 6:
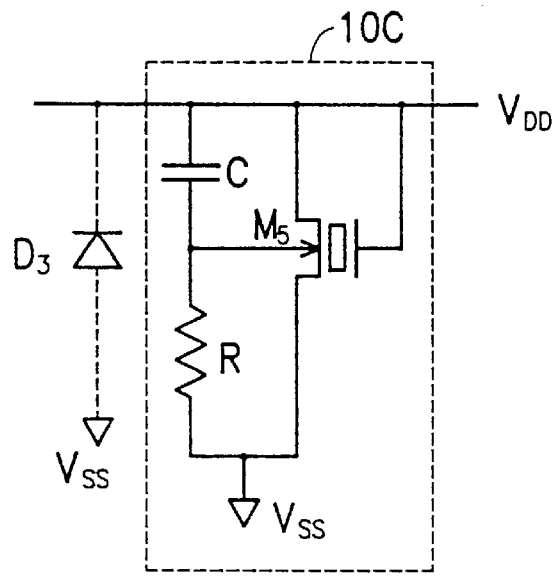
FIG. 6 is a schematic diagram of a capacitor-triggered ESD protection circuit in accordance with the present invention, disposed between the VDD and Vss power rails.

Referring to FIG. 6, a capacitor-triggered ESD protection circuit 10C, in accordance with the invention, of the same structure as ESD protection circuit 10A of FIG. 4, is depicted coupled between two power rails $V_{DD}$ and $V_{SS}$. The power rail $V_{DD}$ is used to receive the power supply potential when the associated integrated circuit is powered. The capacitor-triggered ESD protection circuit 10C comprises a thick oxide device $M_5$, a capacitor C, and a resistor R. The thick oxide device $M_5$ is configured with its drain connected to the power rail $V_{DD}$ and with its source connected to circuit ground $V_{SS}$. The gate of the thick oxide device $M_5$ is also tied to the power rail VDD. The bulk of the thick oxide device $M_5$ is coupled by the resistor R to circuit ground $V_{SS}$. The capacitor C is connected between the power rail $V_{DD}$ and the bulk of the device $M_5$. In addition, a diode $D_3$ is preferably connected between circuit ground $V_{SS}$ and the power rail $V_{DD}$ via its anode and cathode, respectively.

Figure 7:
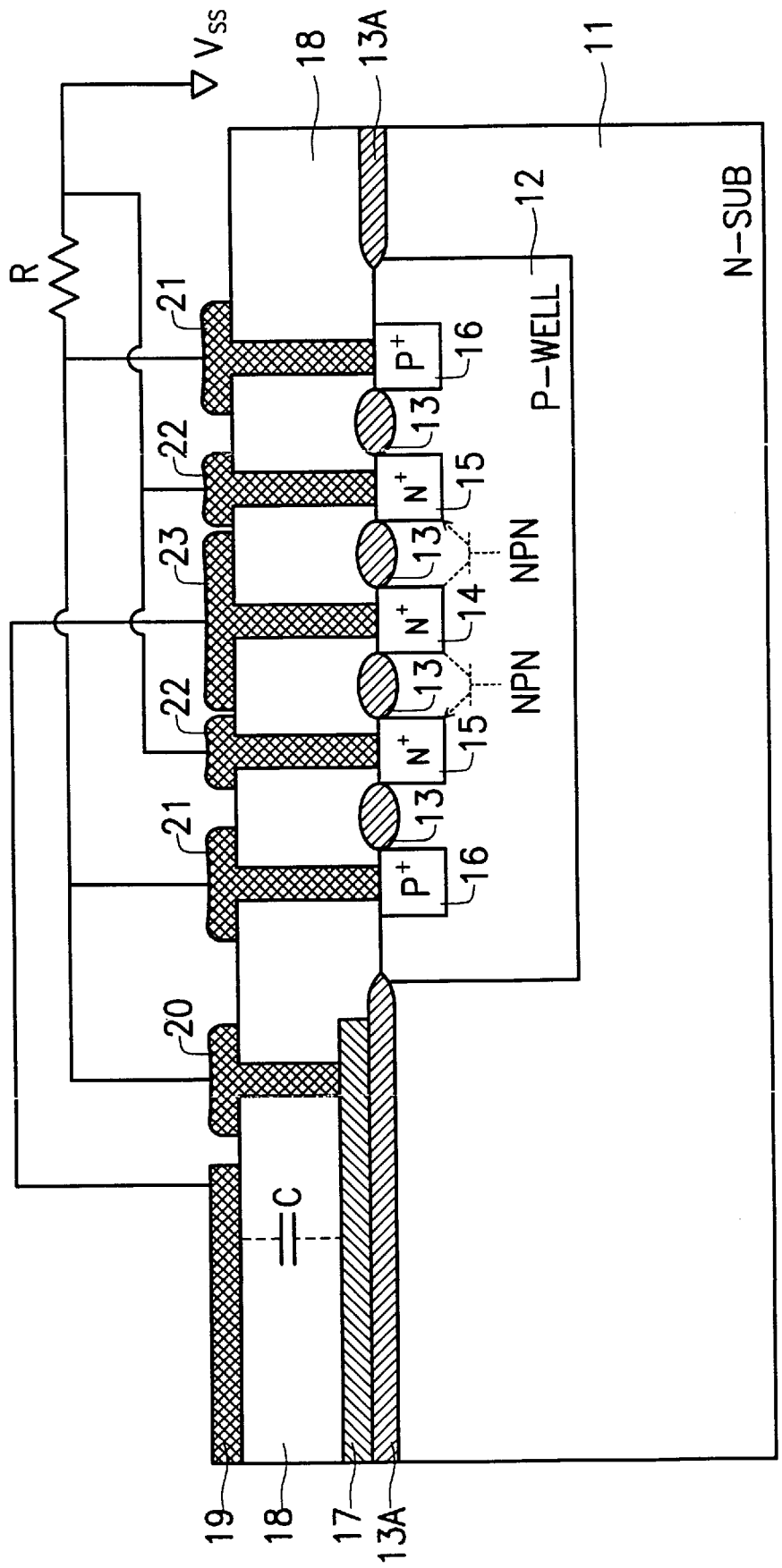
FIG. 7 is a cross-sectional view of one preferred embodiment of the capacitor-triggered ESD protection circuits according to FIGS. 4–6, fabricated onto a semiconductor substrate.

Referring to FIG. 7, one preferred embodiment, in accordance with the present invention, of the capacitor-triggered ESD protection circuits 10A–10C depicted in FIGS. 4–6, respectively, as fabricated onto a semiconductor substrate, is illustrated in a cross-sectional view. As shown in the drawing, a P-well region 12 is formed in an N-type substrate 11. Field oxide portions 13 and 13A are thermally grown, preferably by a LOCOS (local oxidation of silicon) process, overlying a predetermined area of the substrate, as isolating structures. A first heavily-doped N-type region 14 is formed in the P-well region 12 as the drain terminal of the thick oxide device $M_5$. At least a second heavily-doped N-type region 15 (two second heavily-doped regions are exemplified in FIG. 7) is formed in the P-well region 12 as the source terminal of the thick oxide device $M_5$ and is spaced apart from the first heavily-doped region 14 by one of the field oxide portions 13. At least one contact region 16 (two contact regions are exemplified in FIG. 7) is formed in the P-well region 12 by implanting P-type 30 impurities therein. Each contact region 16 is spaced apart from the adjacent second heavily-doped region 15 by one of the field oxide portions 13 to form the bulk terminal of the thick oxide device $M_5$.

A polysilicon layer 17 doped with impurities is formed on one of the field oxide portions 13A, preferably at one side of the substrate 11. A dielectric layer 18 is deposited to cover the overall surface and then is etched to shape several contact windows in order to expose the polysilicon layer 17, contact regions 16, first N-type heavily-doped region 14 and second N-type heavily-doped regions 15, respectively. A metal pad 19, that can be the input pad 5 of FIG. 4, the output pad 7 of FIG. 5, or the power rail $V_{DD}$ of FIG. 6, depending on the configuration in which the circuit of the invention is used, is formed on the dielectric layer 18 above the polysilicon layer 17. Accordingly, the pad 19, the dielectric layer 18, and the polysilicon layer 17 form a capacitor C. The capacitor C is formed by the pad 19 and the polysilicon layer 17 therebelow without consuming extra layout area. A plurality of metal contacts 20, 21, 22, 23 are formed on the dielectric layer 18 and are connected to the polysilicon layer 17, contact regions 16, second heavily-doped regions 15, and first heavily-doped region 14 via the associated contact windows, respectively. Note that the metal contact 23 preferably covers over the field oxide portions 13 on the opposing sides of the first N-type heavily-doped region 14 and functions as the gate terminal of the thick oxide device $M_5$.

According to the capacitor-triggered ESD protection circuits depicted in FIGS. 4–6, the pad 19 is electrically coupled to the first heavily-doped N-type region 14 via the metal contact 23. The polysilicon layer 17 is electrically coupled by the metal contacts 20 and 21 to the contact regions 16, and then coupled to circuit ground $V_{SS}$ by the resistor R. Although designated by a component symbol, the resistor R may be made of a thin-film resistor or may be a well resistor or any other electrical resistance component. Moreover, the second heavily-doped N-type regions 15 are electrically coupled by the metal contact 22 to circuit ground $V_{SS}$.

As shown in FIG. 7, the thick oxide device $M_5$ is operated in a bipolar mode, in which the first N-type heavily-doped N-type region 14, the P-well region 12, and the second heavily-doped N-type regions 15 constitute the collector, base, and emitter of an NPN bipolar junction transistor, during an ESD event. When occurring at the pad 19, the voltage of a positive-to-ground ESD pulse is coupled to the well region 12 by the capacitor C to forward bias the junction between the P-well region 12 and the second heavily-doped N-type region 15. Consequently, the NPN bipolar transistor is directly operated in snapback mode without causing drain breakdown to work in snapback region and then bypass the ESD current. Accordingly, the trigger-on voltage of the ESD protection circuit can be reduced during the ESD stress. Therefore, the ESD stress occurring at the pad 19 bypasses the ESD current flowing from the first heavily-doped N-type region 14 to the second heavily-doped N-type regions 15 and is then discharged to circuit ground $V_{SS}$. The ESD discharge current disperses through two opposing sides of the first N-type heavily-doped region 14 shown in FIG. 7, in effect minimizing local heating of the ESD protection circuit. Moreover, the triggering voltage of the ESD protection circuit is lowered to the level of the snapback voltage but not to the level of the breakdown voltage. This turned-on voltage clamps the pad 19 to a low voltage level so that the internal circuit 6, as well as the output buffer, are protected from ESD damage.

Because the well region 12 is coupled by the resistor R to circuit ground $V_{SS}$, the resistor R and the capacitor C provide a time delay to sustain the forward bias between the P-well region 12 and the second heavily-doped N-type 10 regions 15 during the ESD event. As exemplified by the HBM model, the rise time of the ESD pulse is about 10 ns.

Therefore, the RC time constant can be adjusted to the range of about 10 ns to sustain the forward bias during the ESD event. Accordingly, the capacitance of the capacitor C may be selected from the range of about 0.2–2pF, and the resistance of the resistor R may be selected from the range of about 5 Kω to about 50 Kω. However, while the power rail $V_{DD}$ is powered in normal operation, the thick oxide device $M_5$ is turned off and the well region 12 is grounded via the resistor R and therefore will not float.

The diode $D_1$, as depicted in FIG. 4, may be built by another $N^+$/p-well junction. When a negative-to-ground ESD pulse appears at the input pad 5, the diode $D_1$ is forward biased to bypass the ESD stress, thereby protecting the 25 internal circuit 6 from ESD damage.

The diode $D_2$, as depicted in FIG. 5, can be formed by the junction between the drain and the bulk of the NMOS transistor $M_2$ of the output buffer; the connection of diode $D_2$ is therefore designated by a dashed line. When a negative-to-ground ESD pulse appears at the output pad 7, the diode $D_2$ is forward biased to bypass the ESD stress, thereby protecting the internal circuit 6 from ESD damage. Because of the existence of the ESD protection circuit, the conventional circuit technique of enlarging the spacing between the gate and the drain of the NMOS transistor $M_2$ in consideration of ESD immunity is unnecessary. Consequently, the layout area allocated for the output buffer can be diminished.

The diode $D_3$, as depicted in FIG. 6, may be formed by guard rings of the substrate 11 and another P-well region; the connection of diode $D_3$ is therefore designated by a dashed line.

Figure 8:
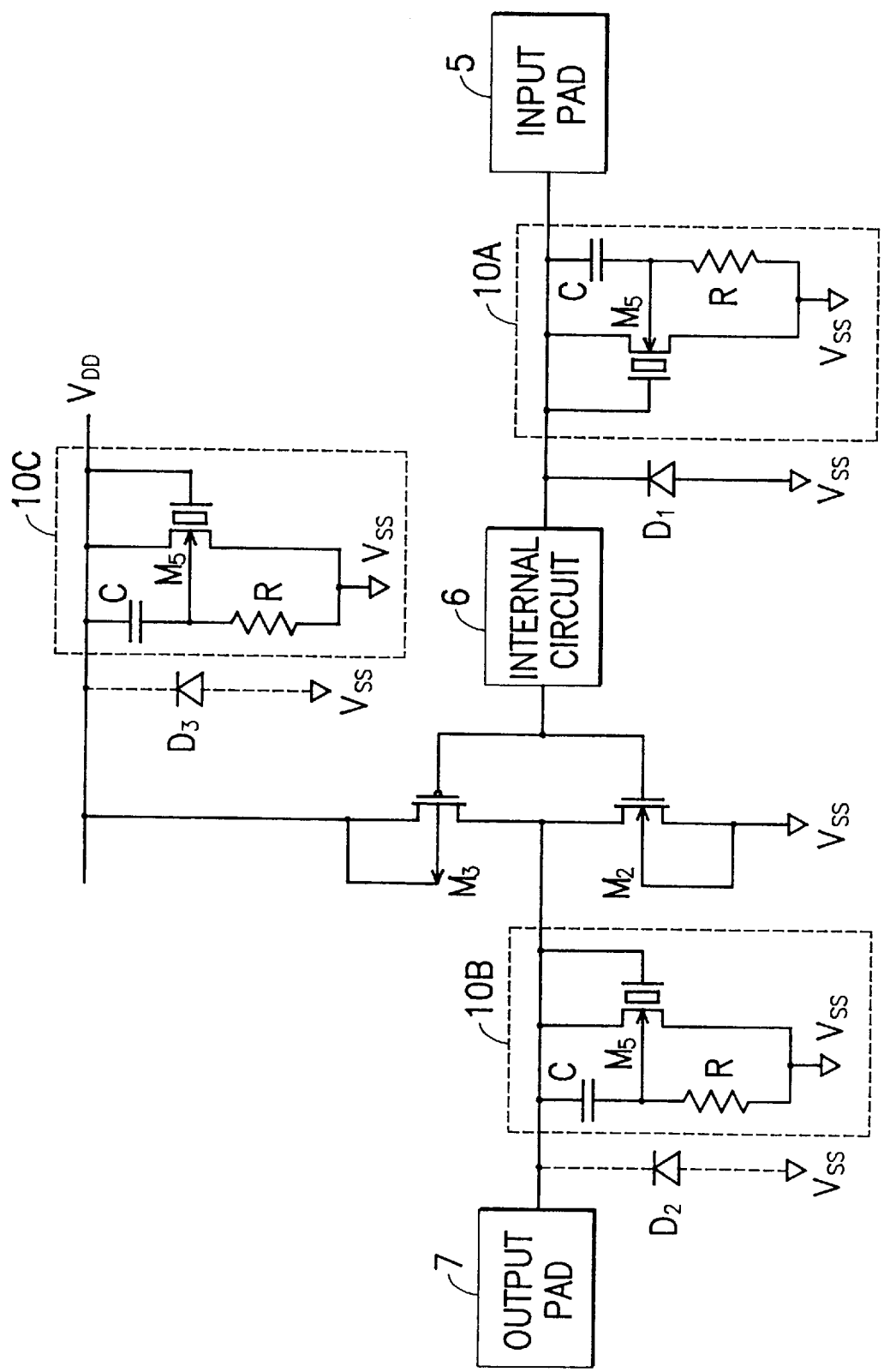
FIG. 8 depicts a schematic diagram of an IC utilizing the capacitor-triggered ESD protection circuit in accordance with the present invention.

Referring to FIG. 8, the capacitor-triggered ESD protection circuits, in accordance with the invention, are depicted as disposed on the entire chip. There are four different ESD modes that can occur at either the input pad 5 or the output pad 7. The input pad 5 and the output pad 7 are likely to introduce ESD to the IC device because each connects to a lead pin of the IC device. The ESD modes include the following:

(a) PS mode. The $V_{DD}$ terminal of the entire device is kept floating and the $V_{SS}$ terminal of the device is grounded while a positive ESD stress is present at an IC pad.

(b) NS mode. The $V_{DD}$ terminal of the entire device is kept floating and the $V_{SS}$ terminal of the device is grounded while a negative ESD stress is present at an IC pad.

(c) PD mode. The $V_{SS}$ terminal of the entire device is kept floating and the $V_{DD}$ terminal of the device is grounded while a positive ESD stress is present at an IC pad.

(d) ND mode. The $V_{SS}$ terminal of the entire device is kept floating and the $V_{DD}$ terminal of the device is grounded while a negative ESD stress is present at an IC pad.

During the PS mode of ESD, the ESD current is directed to flow through the circuit 10A or the circuit 10B. During the NS mode of ESD, the ESD current is bypassed by the diode $D_1$ or $D_2$. During the PD mode of ESD, the ESD current flows through the ESD protection circuit 10A or 10B, $V_{SS}$, and the forward biased diode $D_3$, and then flows to the power rail $V_{DD}$. During the ND mode of ESD, the ESD current flows through the ESD protection circuit 10C, the floating $V_{SS}$, and the diode $D_1$ or $D_2$ to bypass the ESD stress. Because the pull-up device $M_3$ of the output buffer is conducted by hole carriers, it is hard to flow ESD current therethrough. In all cases, the internal circuit is protected from ESD damage.

In conclusion, the invention utilizes a capacitor-triggered ESD protection circuit to protect an internal circuit from ESD damage. The same circuit may be used at the input pads, the output pads, and the power rail of the IC. Moreover, the fabrication process is compatible with CMOS fabrication techniques and does not consume extra layout areas.

Alternative embodiments of the present invention have now been described in detail. It is to be noted, however, that this description of these embodiments is also illustrative of the principles underlying the inventive concept. It is therefore contemplated that various modifications of the disclosed embodiments will, without departing from the spirit and scope of the present invention, be apparent to persons of ordinary skill in the art, and the scope of the invention is intended to be limited only by the appended claims.

What is claimed is:

1. A capacitor-triggered electrostatic discharge protection circuit, comprising:

an N-type semiconductor substrate;

a P-well region formed in the substrate;

a P-type contact region formed in the P-well region;

an isolating structure formed on the substrate;

a polysilicon layer formed on the isolating structure and coupled to the contact region;

a dielectric layer overlying the polysilicon layer;

a metal pad formed on the dielectric layer wherein the metal pad, the dielectric layer, and the polysilicon layer form a capacitor;

a first heavily-doped N-type region and a second heavily-doped N-type region formed in the P-well region and spaced apart to constitute, with the P-well region, a bipolar junction transistor, wherein the first heavily doped region is coupled to the metal pad and the second heavily-doped region is coupled to a ground; and a resistor connected between the contact region and the ground.

2. The circuit as claimed in claim 1, wherein the first heavily-doped region is spaced apart from the second heavily-doped region by field oxide.

3. The circuit as claimed in claim 2, wherein the metal pad is an input pad to a protected circuit.

4. The circuit as claimed in claim 3, further comprising a diode having an anode and a cathode, wherein the anode is coupled to the ground and the cathode is coupled to the input pad.

5. The circuit as claimed in claim 2, wherein the metal pad is an output pad from a protected circuit.

6. The circuit as claimed in claim 5, further comprising an output buffer connected to the output pad, wherein the output buffer includes an NMOS transistor having a buffer drain connected to the output pad and a buffer source and a buffer bulk coupled together to the ground.

7. The circuit as claimed in claim 6, wherein a junction between the buffer drain and the buffer bulk forms a diode having an anode coupled to the ground and further having a cathode coupled to the output pad.

8. The circuit as claimed in claim 2, wherein the metal pad is a power rail.

9. The circuit as claimed in claim 8, further comprising a diode having an anode and a cathode, wherein the anode is coupled to the ground and the cathode is coupled to the power rail.

* * * * *